(12) United States Patent
Bowles et al.

(10) Patent No.: US 9,376,310 B2
(45) Date of Patent: Jun. 28, 2016

(54) MICROELECTRONIC PACKAGES HAVING STACKED ACCELEROMETER AND MAGNETOMETER DIE AND METHODS FOR THE PRODUCTION THEREOF

(71) Applicant: FREESCALE SEMICONDUCTOR INC., Austin, TX (US)

(72) Inventors: Philip H. Bowles, Gilbert, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/806,481

(22) Filed: Jul. 22, 2015

(65) Prior Publication Data

US 2015/0329352 A1 Nov. 19, 2015

Related U.S. Application Data

(62) Division of application No. 14/197,962, filed on Mar. 5, 2014, now Pat. No. 9,108,841.

(51) Int. Cl.
| | |
|---|---|
| *B81B 7/00* | (2006.01) |
| *H01L 25/00* | (2006.01) |
| *H01L 25/16* | (2006.01) |
| *B81B 7/02* | (2006.01) |

(52) U.S. Cl.
CPC .............. *B81B 7/0074* (2013.01); *B81B 7/02* (2013.01); *H01L 25/16* (2013.01); *H01L 25/50* (2013.01); *B81B 7/007* (2013.01); *B81B 7/0041* (2013.01); *B81B 2201/0235* (2013.01); *B81B 2201/0242* (2013.01); *B81B 2201/0292* (2013.01); *B81B 2207/096* (2013.01); *H01L 2224/48091* (2013.01)

(58) Field of Classification Search
CPC .. H01L 23/315; H01L 41/053; G01C 19/574; G01P 2015/0862; G01P 2015/0877; B81B 2201/0242
USPC .............................. 73/504.12, 514.32, 514.38
See application file for complete search history.

(56) References Cited

U.S. PATENT DOCUMENTS

| | | | |
|---|---|---|---|
| 6,713,314 B2 * | 3/2004 | Wong ...................... | H01L 21/50 257/E21.499 |
| 2004/0140475 A1 * | 7/2004 | Sun ....................... | B81C 1/00269 257/100 |
| 2006/0001123 A1 * | 1/2006 | Heck ...................... | B81C 1/0023 257/528 |

* cited by examiner

*Primary Examiner* — Karen Kusumakar

(57) ABSTRACT

Methods for fabricating multi-sensor microelectronic packages and multi-sensor microelectronic packages are provided. In one embodiment, the method includes positioning a magnetometer wafer comprised of an array of non-singulated magnetometer die over an accelerometer wafer comprised of an array of non-singulated accelerometer die. The magnetometer wafer is bonded to the accelerometer wafer to produce a bonded wafer stack. The bonded wafer stack is then singulated to yield a plurality of multi-sensor microelectronic packages each including a singulated magnetometer die bonded to a singulated accelerometer die.

20 Claims, 6 Drawing Sheets

MICROELECTRONIC PACKAGES HAVING STACKED ACCELEROMETER AND MAGNETOMETER DIE AND METHODS FOR THE PRODUCTION THEREOF

CROSS-REFERENCE TO RELATED APPLICATION

This application is a divisional of co-pending U.S. application Ser. No. 14/197,962, filed Mar. 5, 2014.

TECHNICAL FIELD

Embodiments of the present invention relate generally to microelectronic packaging and, more particularly, to microelectronic packages including stacked accelerometer and magnetometer die, as well as to methods for the fabrication thereof.

BACKGROUND

Microelectronic packages are now commonly produced to contain two or more multi-axis sensors. For example, a microelectronic package may include a three axis accelerometer and a three axis magnetometer contained within a molded package body. The magnetometer may be a solid state device, which is produced on a first semiconductor substrate or die (referred to herein as a "magnetometer die"). By comparison, the accelerometer may be a Microelectromechanical Systems (MEMS) device, which is formed on a second semiconductor substrate or die (referred to herein as an "accelerometer die"). During fabrication of the package, a separate die or cap piece may be bonded over the accelerometer die to enclose the MEMS transducer structure within a hermetically-sealed cavity to optimize performance of the accelerometer. After bonding of the cap piece, a pick-and-place tool may be utilized to position the magnetometer die over the cap piece. The magnetometer and accelerometer die may then be interconnected and overmolded or otherwise encapsulated within a dielectric material. Depending upon desired package functionality, additional sensors and/or other microelectronic components may also be combined with the magnetometer and accelerometer. For example, a three axis MEMS gyroscope may further be combined with the three axis accelerometer and magnetometer to produce a microelectronic package, such as an Inertial Measurement Unit (IMU), having nine Degrees-of-Freedom (DOF).

BRIEF DESCRIPTION OF THE DRAWINGS

At least one example of the present invention will hereinafter be described in conjunction with the following figures, wherein like numerals denote like elements, and.

Figure 1:
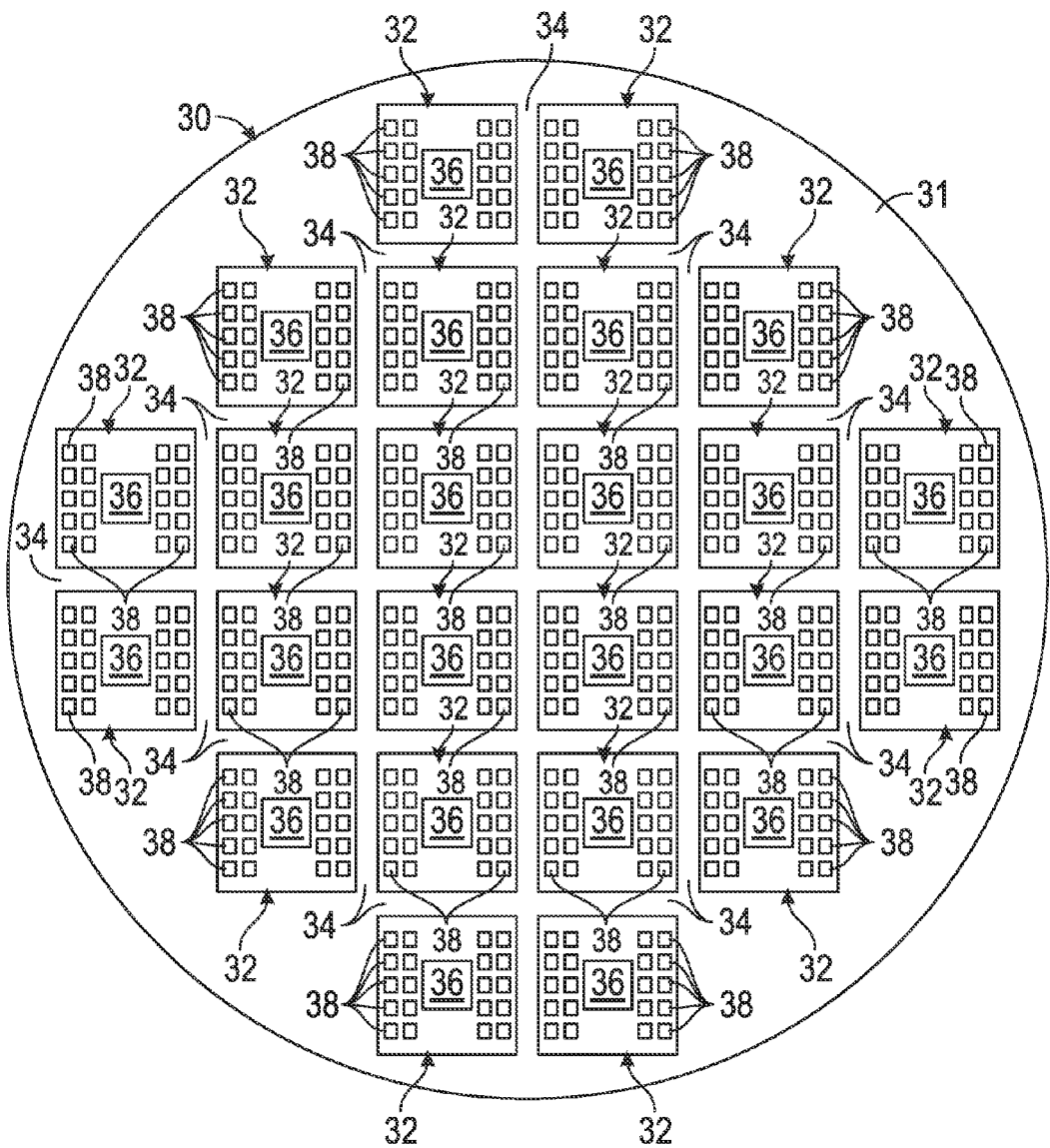
FIG. 1 is a planform or top-down view of an accelerometer wafer, which includes an array of non-singulated accelerometer die and which may be processed in accordance with a first exemplary embodiment of the microelectronic package fabrication method.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. It will thus be understood that such terms may be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, MEMS devices, passive electronic components (e.g., a discrete resistor, capacitor, inductor, or diode), optical devices, and other small scale electronic devices capable of providing processing, memory, sensing, radiofrequency, optical, and actuator functionalities, to list but a few examples. The term "wafer" is utilized to encompass bulk semiconductor (e.g., silicon)

wafers, layered structures (e.g., silicon-on-insulator substrates), and other structures over which number of semiconductor devices, MEMS devices, or the like can be produced utilizing global or wafer-level processing techniques. The term "die" is utilized in reference to a singulated piece of a wafer on which one or more integrated circuits, MEMS devices, and/or another microelectronic component has fabricated via wafer-level processing of the wafer. Finally, as still further appearing herein, the phrase "produced on," the phrase "fabrication on," and the like encompass the terms "over" and "in" such that a device "fabricated on" a semiconductor wafer may be produced over a principal surface thereof, in the body of the wafer, or a combination thereof.

As indicated in the foregoing section entitled "BACKGROUND," microelectronic packages are now commonly produced to contain a multi-axis accelerometer and a multi-axis magnetometer, which are carried by an accelerometer die and a magnetometer die, respectively. To optimize the performance of such a microelectronic package, the accelerometer die and the magnetometer die are ideally positioned such that sensing axes of the accelerometer are precisely aligned with the sensing axes of the magnetometer. It can be difficult, however, to ensure precise alignment between the sensing axes of the accelerometer and magnetometer within exacting tolerances (e.g., tolerances on the order of a few hundredths of a degree) utilizing conventional fabrication methods. For example, even when carefully controlled, a pick-and-place tool of the type conventionally utilized to position the magnetometer die relative to the accelerometer die during package fabrication may only achieve rotational alignment tolerances of about 1-2°. As a result, it may be necessary to thoroughly test the alignment between the sensing axes of the magnetometer and accelerometer during or after package fabrication; and to perform calibrations or otherwise compensate for any detected misalignments between the sensing axes. This adds undesired cost, complexity, and time to the fabrication process. There thus exists a current industry demand to provide improved multi-sensor microelectronic package fabrication methods, which ensure highly accurate alignment between the sensing axes of accelerometer and magnetometer die on a repeatable and cost-effective basis.

The following describes embodiments of a method for producing a microelectronic package containing an accelerometer die and a magnetometer die, which is positioned over and bonded to the accelerometer die. Embodiments of the below-described fabrication method are advantageously carried-out utilizing a wafer level stacking process, which enables highly precise alignment between the sensing axes of the accelerometer and magnetometer die to be achieved on a repeatable basis. In at least some instances, rotational alignments between the sensing axes within a few hundredths of a degree may be reliably achieved. Testing requirements to ensure alignment between the sensing axes and post-fabrication calibration requirements may be greatly reduced, if not rendered unnecessary, as a result. The wafer stacking process also enables the sensing axes of numerous accelerometer and magnetometer die pairs to be aligned simultaneously, while the die remain in wafer form to improve manufacturing efficiency. As an additional benefit, the magnetometer die may be bonded directly to the accelerometer die during performance of the below-described fabrication method to form a hermetically-sealed cavity in which the accelerometer MEMS structure is enclosed. In this manner, the magnetometer die may be utilized to "cap" the accelerometer die thereby eliminating the need for a separate cap piece to reduce package size and cost. An exemplary embodiment of microelectronic package fabrication process during which a magnetometer wafer is stacked onto an accelerometer wafer will now be described in conjunction with FIGS. 1-9.

Referring initially to FIG. 1, an exemplary accelerometer wafer 30 is schematically shown from a top-down or planform view. Accelerometer wafer 30 includes a frontside 31 over which a number of accelerometer die 32 have been produced by wafer-level processing. At this juncture in the fabrication process, accelerometer die 32 remain interconnected as a solid wafer and may consequently be referred to below as "non-singulated accelerometer die 32." Accelerometer die 32 are spatially distributed across wafer 30 in, for example, a grid arrangement. While a relatively limited number of die 32 are shown in FIG. 1, any practical number of accelerometer die 32 can be distributed across wafer 30 in various different spatial arrangements. Accelerometer die 32 are interspersed with a number of saw lanes 34, which are areas of wafer 30 lacking active circuitry that are removed during singulation of wafer 30. Each accelerometer die 32 is produced to include a MEMS transducer structure 36 and a number of bond pads 38, which are disposed over the frontside of the die to provide points-of-contact to the circuitry formed thereon (not shown). MEMS transducer structure 36 may be located in a central region of each die 32, while bond pads 38 may be disposed in one or more rows bordering structure 36. It will be appreciated, however, that the illustrated layout is offered by way of example only and will vary amongst different embodiments.

Figure 2:
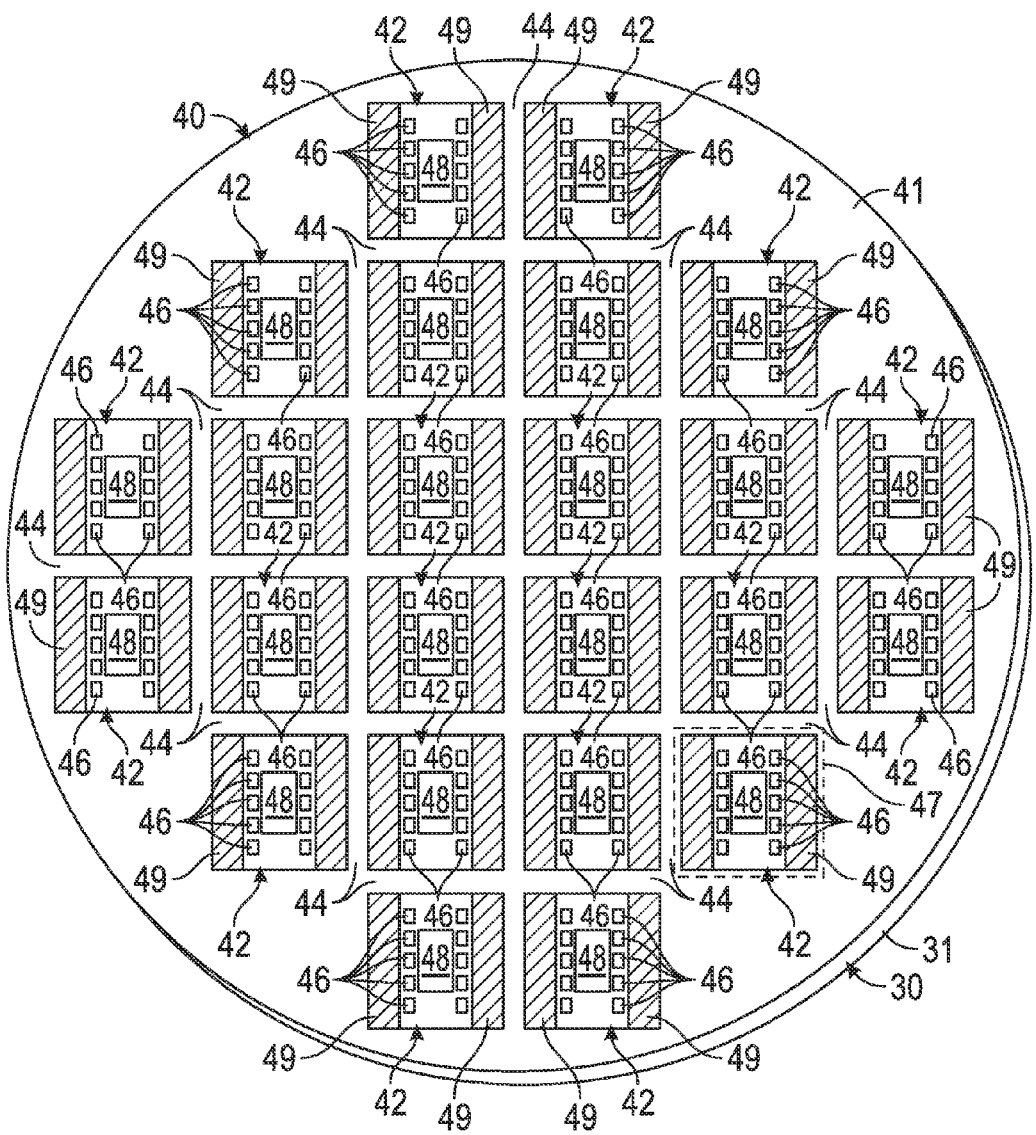
FIG. 2 is a top-down view of a magnetometer wafer, which may positioned over and bonded to the accelerometer wafer shown in FIG. 1 to yield a wafer stack during performance of the exemplary microelectronic package fabrication method.

FIG. 2 is a top-down view of a magnetometer wafer 40, which may positioned over or stacked with accelerometer wafer 30 during an exemplary embodiment of the package fabrication method. When stacked in this manner, magnetometer wafer 40 and accelerometer wafer 30 may be collectively referred to as "wafer stack 30, 40." As shown in FIG. 2, magnetometer wafer 40 has been processed to include an array of non-singulated magnetometer die 42, which are distributed across the frontside 41 of wafer 40. Magnetometer wafer 40 is produced to include the same die number and the same general die arrangement as accelerometer wafer 30 such that, when wafer 40 is stacked onto wafer 30, each magnetometer die 42 overlies a different accelerometer die 32 (FIG. 1), as described more fully below in conjunction with FIG. 3. Furthermore, as does accelerometer wafer 30, magnetometer wafer 40 includes a number of saw lanes 44, which are interspersed with magnetometer die 42. When magnetometer wafer 40 is stacked onto accelerometer wafer 30, saw lanes 44 of wafer 40 generally align with saw lanes 34 of wafer 30 (FIG. 1) such that a common singulation process may be utilized to separate wafer stack 30, 40 into individual pieces.

Magnetometer die 42 each include a solid state magnetometer 48 and a number of bond pads 46, which provide points-of-contact to non-illustrated circuitry formed on the frontside of die 42. As indicated in FIG. 2, each magnetometer 48 may be formed on a central portion of its corresponding die 42, while bond pads 46 may be arranged in rows bordering magnetometer 48; however, again, this layout is merely exemplary and will vary amongst embodiments. As further indicated in FIG. 2 by cross-hatching, die 42 may also include outer sacrificial regions 49 lacking active circuitry. When wafers 30 and 40 are stacked, sacrificial regions 49 may overlay and cover bond pads 38 (FIG. 1) provided on the underlying accelerometer die 32. Sacrificial regions 49 may thus be removed after wafer stacking using, for example, a saw-to-reveal process to expose the bond pad shelves of accelerometer die 32 on which bond pads 38 (FIG. 1) are disposed. This, in turn, allows aligning pairs of accelerometer die 32 and magnetometer die 42 to be interconnected by wirebonding in the below-described manner. This notwithstanding, magnetometer die 42 need not include sacrificial regions 49 in all embodiments, and other types of interconnections may be utilized to interconnect corresponding pairs of die 32 and 42 in further embodiments.

By the nature of their structure, magnetometer die tend to be more compact than do accelerometer die; e.g., in many cases, a magnetometer may be one half or one third the size of a corresponding accelerometer die. The spacing between magnetometer die 42 and/or the overall planform dimensions of each die 42 may thus be increased to ensure proper vertical alignment between corresponding pairs of accelerometer die 32 and magnetometer die 42 when wafers 30 and 40 are stacked in the manner shown in FIG. 2. This, in turn, may result in a slight decrease in the overall device density of magnetometer wafer 40. However, any cost penalty associated with this decrease in magnetometer wafer density may be more than offset by cost savings achieved by utilizing magnetometer die 42 to cap accelerometer die 32 (instead of a separate cap piece) as described below; and/or by eliminating or at least reducing testing and calibration procedures that may otherwise required to ensure acceptable alignment between the sensing axes of die 32 and 42 (and, specifically, between the accelerometers and magnetometers carried thereby). A lower magnetometer wafer density may also allow the planform dimensions of magnetometer die 42 to be increased potentially improving magnetometer performance. Additionally, regions of magnetometer die 42 that remain unoccupied by magnetometer structures 48, bond pads 46, or the associated circuitry may be utilized by, for example, fabricating additional control circuitry thereon or otherwise imparting this area of die 42 with a functionality useful in the package design.

Figure 3:
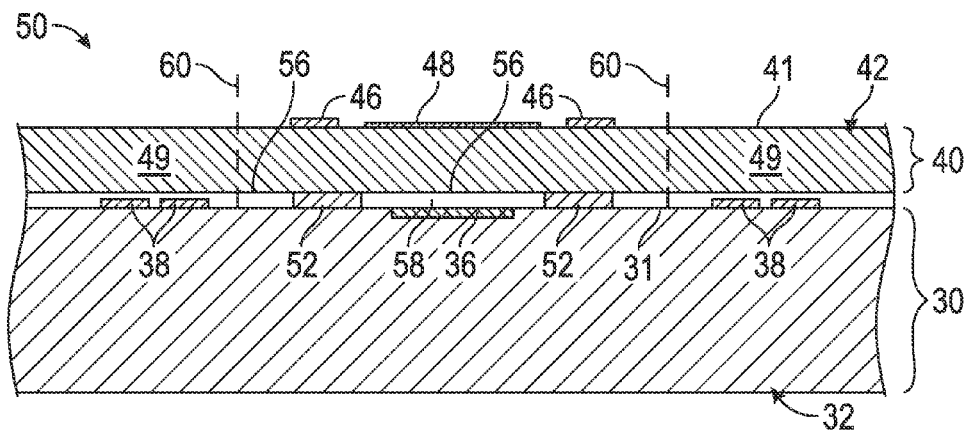
FIG. 3 is a cross-sectional view of a region of the wafer stack shown in FIG. 2, which encompasses a magnetometer die and an underlying accelerometer die and which may be processed to produce a multi-sensor microelectronic package in parallel with a number of other microelectronic packages during the fabrication method.

FIG. 3 is a cross-sectional view taken through a relatively small region of wafer stack 30, 40, which contains a single magnetometer die 42 and accelerometer die 32 and which generally corresponds to dashed box 47 identified in FIG. 2. Hereafter, the following description and the accompanying figures will focus primarily on the manner in which the illustrated portion of wafer stack 30, 40 shown in FIG. 3 is processed to produce a single multi-sensor microelectronic package (identified hereafter by reference numeral "50"). Microelectronic package 50 is shown at various stages of completion in FIGS. 3-7 and in a completed state in FIG. 8. As shown in FIGS. 3-8 and described below, microelectronic package 50 is provided by way of non-limiting example only. It will be appreciated that various other types of microelectronic packages can be produced utilizing embodiments of the below-described method, which may include structural features and functionalities other than those of package 50. While the following description focuses primarily on the processing of the relatively limited region of wafer stack 30, 40 from which microelectronic package 50 is produced, it will be understood that the below-described process steps will typically be performed globally across wafer stack 30, 40 to produce a plurality of microelectronic packages in parallel with microelectronic package 50, which may or may not be substantially identical to package 50.

During or after wafer stacking, magnetometer wafer 40 (FIGS. 2 and 3) is bonded to accelerometer wafer 30 (FIG. 1) at multiple locations such that each magnetometer die 42 is bonded to an underlying accelerometer die 32. Each bonded pair of magnetometer die 42 and accelerometer die 32 may be collectively referred to as "bonded sensor die stack 32, 42" or, more simply, "sensor die stack 32, 42" hereafter. With reference to partially-fabricated package 50 shown in FIG. 3, specifically, magnetometer die 42 is positioned over and bonded to accelerometer die 32 to yield a bonded die stack 32, 42. In the illustrated example, magnetometer die 42 is bonded to accelerometer die 32 (and, more generally, magnetometer wafer 40 is bonded to accelerometer wafer 40) in a face-up orientation. Thus, indicated in FIG. 3, the non-active surface or backside 56 of magnetometer die 42 (and, therefore, the backside of magnetometer wafer 40) is bonded to the active surface or frontside 31 of accelerometer die 32 (and, thus, the frontside of accelerometer wafer 30). In further embodiments, magnetometer wafer 40 may be bonded to accelerometer wafer 30 in an inverted or face-down orientation such that the respective frontsides 41 of magnetometer die 42 are bonded to the frontsides 31 of the corresponding accelerometer die 32, as described more fully below in conjunction with FIGS. 9 and 10.

In some embodiments, magnetometer wafer 40 (FIGS. 2 and 3) is bonded to accelerometer wafer 30 (FIG. 1) such that each magnetometer die 42 caps the underlying accelerometer die 32 and, perhaps, forms a hermetically-sealed cavity therewith. In this regard, rings of bonding material (referred to herein as "seal rings") may be deposited between wafers 30 and 40 at selected locations circumscribing or extending around the MEMS transducer structures 36 formed on accelerometer wafer 30. This may be more fully appreciated by referring to FIG. 3 wherein one such seal ring 52 has been deposited between magnetometer die 42 and accelerometer die 32. While shown in cross-section, it will be appreciated that seal ring 52 forms a continuous 360° seal and may have a generally rectangular, square, circular, or other planform geometry. Seal ring 52 circumscribes MEMS transducer structure 36, as taken along an axis orthogonal to the frontside 31 of accelerometer die 32 and wafer 30. Seal ring 52 is deposited to a thickness sufficient to create a vertical standoff or gap between backside 56 of magnetometer die 42 and frontside 31 of accelerometer die 32. As a result, a hermetically-sealed cavity 58 is formed between the adjacent surface of magnetometer die 42 and accelerometer die 32, is circumferentially bound by seal ring 52, and encloses MEMS transducer structure 36. Hermetically-sealed cavity 58 contains a known pressure selected to optimize performance of MEMS transducer structure 36. In one embodiment, the pressure within hermetically-sealed cavity 58 may be about 1 atmosphere (atm); however, the pressure within cavity 58 may be greater or less than 1 atm in other embodiments.

Any material suitable for creating a hermetic or airtight seal and suitable for attaching magnetometer die 42 to accelerometer die 32 can be utilized to form seal ring 52 (and the other non-illustrated seal rings created across wafer stack 30, 40 shown in FIG. 2). A non-exhaustive list of suitable bonding materials includes aluminum-germanium alloy, copper, and copper alloys. Such materials may be deposited to form seal ring 52 and the other non-illustrated seal rings utilizing a plating process in an embodiment; however, other deposition methods can be utilized in further embodiments. After deposition of seal rings 52 at the desired locations, a bonding process may be performed during which die 32 and 42 (and, more generally, wafers 30 and 40) are brought into contact and subject to heat treatment to melt or soften the bonding material and thereby form the desired seals. The bonding process can be carried-out at a controlled pressure to impart hermetically-sealed cavity 58 (FIG. 3) and the other non-illustrated cavities with a desired internal pressure. The pressure at which the bonding process is carried-out may be greater than the desired pressure within cavity 58 if the bonding process is performed under elevated temperature conditions. To provide a non-limiting example, if it is desired for the pressure within cavity 58 to be approximately 1 atm, the bonding process may be carried-out at a pressure of 2-4 atm and at an elevated temperature such that the desired pressure is achieved within cavity 58 upon cooling of microelectronic package 50.

After bonding wafers 30 and 40, corresponding pairs of accelerometer die 32 and magnetometer die 42 may be interconnected, singulated, and subject to further processing to complete the multi-sensor microelectronic packages. Notably, at this stage in the fabrication process, several benefits have already been achieved. First, precise alignment has been ensured between the sensing axes of die 32 and 42 by virtue of the above-described wafer stacking and alignment process. In many cases, wafer stacking may allow alignment within 50 microns, which, over the span of a 100 millimeter planform dimension (as an example) may translate into an alignment accuracy of about 0.03°. Such alignment accuracies well-exceed those achievable by die-on-die placement utilizing a pick-and-place tool. Second, by directly bonding each magnetometer die 42 to its corresponding accelerometer die 32 to sealingly enclose MEMS transducer structure 36, the need for a separate cap piece is eliminated to reduce package size and fabrication costs. With these benefits achieved, the particular manner in which accelerometer die 32 and magnetometer die 42 are interconnected and packaged during the latter stages of the manufacture method may be of lesser importance and will inevitably vary amongst different embodiments. Nonetheless, for completeness, the following will describe one exemplary and non-limiting manner in which die stack 32, 42 shown in FIG. 3 (and the other die stacks 32, 42 produced across wafer stack 30, 40 shown in FIG. 2) may be interconnected and packaged.

Figure 4:
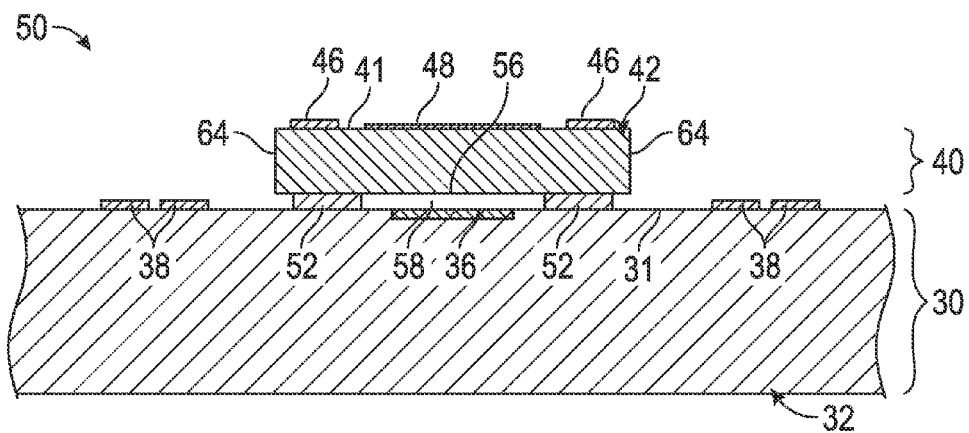
FIGS. 4-8 are cross-sectional views of the microelectronic package shown in FIG. 3, as illustrated in at various stages of completion and fabricated in accordance with the first exemplary fabrication method.
Figure 5:
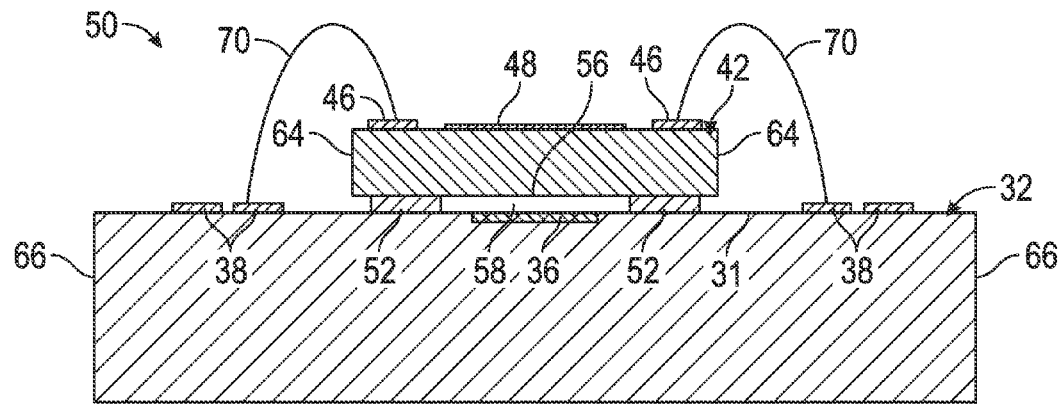

Turning to FIG. 4, a saw-to-reveal process may be carried-out to expose bond pads 38 of the non-singulated accelerometer die 32. During the saw-to-reveal process, selected regions of magnetometer wafer 40 may next be removed to reveal the underlying bond pads 38 of accelerometer die 32. In one embodiment, the selected regions of wafer 40 are removed by forming a number of linear channels, slots, or grooves in wafer 40, as generally indicated in FIG. 3 by dashed lines 60. The channels are conveniently produced utilizing a dicing saw and extend along substantially parallel axes entirely through the thickness of magnetometer wafer 40, but do not penetrate into the underlying accelerometer wafer 30; e.g., the channels may be formed as substantially parallel saw lanes having a depth substantially equivalent to the magnetometer wafer thickness. The channels may extend entirely across magnetometer wafer 40 and, thus, effectively separate wafer 40 into a number of elongated strips; however, this need not always be the case. In the case of microelectronic package 50, specifically, the resulting structure is shown in FIG. 4. As can be seen, the saw-to-reveal process has resulted in the removal of sacrificial regions 49 of magnetometer wafer 40 (FIG. 3) thereby imparting die 42 with vertical sidewalls 64 and exposing bond pad rows 38 provided on the bond pad shelves of accelerometer die 32. If desired, one or more of the newly-exposed bond pad rows 38 may now be wirebonded to bond pads 46 to interconnect die 32 and 42. Alternatively, interconnection of die 32 and 42 may be carried-out after singulation of wafer stack 30, 40.

Figure 6:
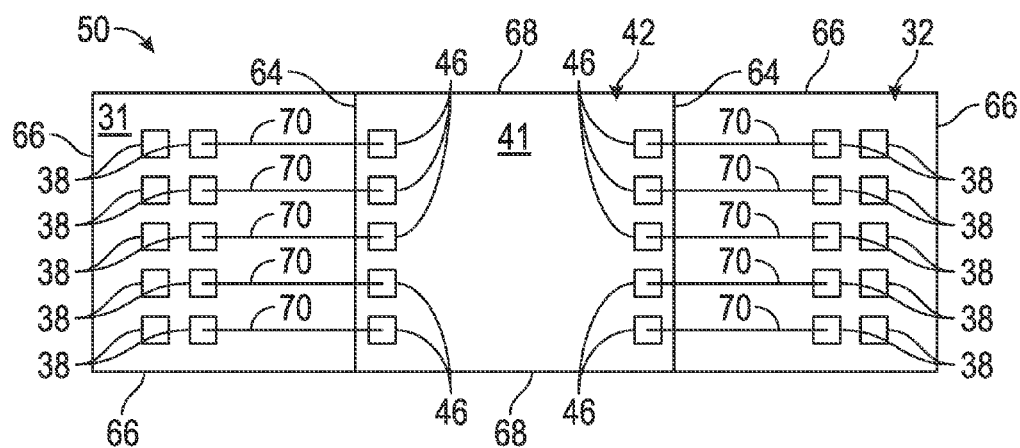
Figure 7:
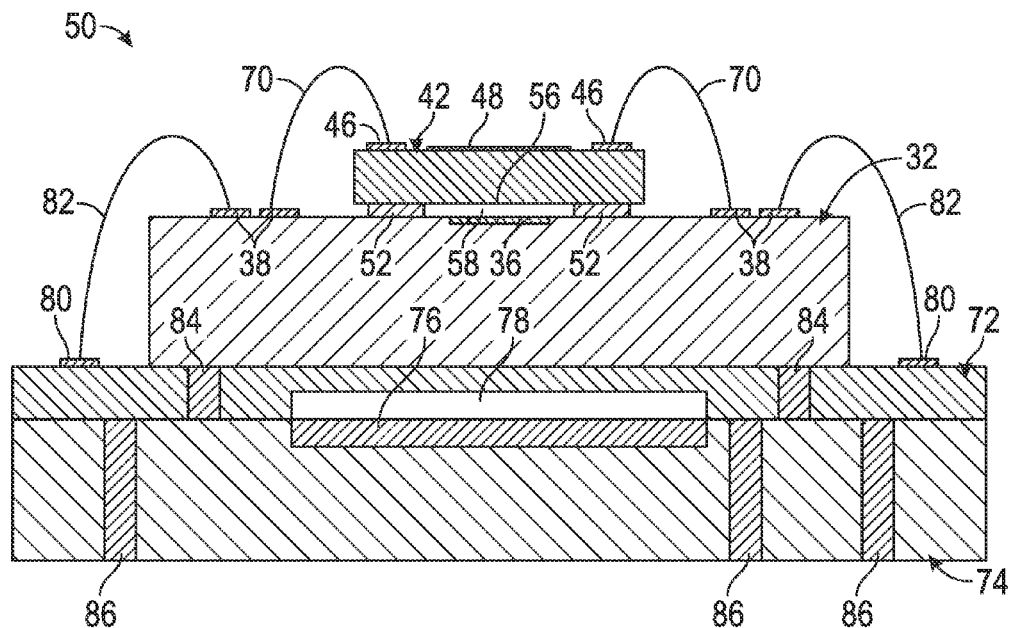

Wafer stack 30, 40 may next be singulated to separate stack 30, 40 into a number of discrete die stacks 32, 42 to be incorporated into different microelectronic packages. FIGS. 6 and 7 illustrate partially-completed microelectronic package 50 including one such die stack 32, 42 produced by singulation of wafer stack 30, 40 (FIG. 2). As can be seen, singulation has imparted accelerometer die 32 with four substantially vertical sidewalls 66. Singulation also imparts magnetometer die 42 with two substantially vertical sidewalls 68 (identified in FIG. 6); the other two substantially vertical sidewalls 64 of die 42 previously defined during the above-described saw-to-reveal process. Singulation is conveniently carried-out utilizing a dicing saw, which is directed through wafer stack 30, 40 along overlapping saw lanes 34 and 44 (FIGS. 1-2); however, other singulation techniques can be utilized to separate stack 30, 40 into discrete pieces including, for example, laser cutting and scribing with punching. If not previously performed, wirebonding may now be utilized to create a number of wire bonds 70 interconnecting magnetometer bond pads 46 with corresponding accelerometer bond pads 38. No longer in wafer form, accelerometer die 32 and magnetometer die 42 may be referred to hereafter as "singulated die."

In certain implementations, the degrees of freedom attributed to microelectronic package 50 and the other microelectronic packages produced across wafer stack 30, 40 (FIG. 2) may be provided exclusively by die 32 and 42. Thus, in embodiments wherein the magnetometer and accelerometer are both three axis devices, microelectronic package 50 may have a total of six DOFs. Alternatively, one or more additional sensors (and/or other microelectronic components) may be packaged with die stack 32, 42 to impart the completed package 50 with additional DOFs. For example, in further implementations, sensor die stack 32, 42 may be further combined with a three axis gyroscope to yield a 9-DOF microelectronic package. Further illustrating this point, FIG. 7 depicts one manner in which sensor die stack 32, 42 may be further stacked onto an Application Specific Integrated Circuit (ASIC) die 72, which has been bonded over a gyroscope die 74. Gyroscope die 74 includes a MEMS transducer structure 76, which may be enclosed within a hermetically-sealed cavity 78 formed between gyroscope die 74 and ASIC die 72. As was previously the case with accelerometer cavity 58, a known pressure may be contained within hermetically-sealed cavity 78. As cavity 78 is fluidly isolated from cavity 58, the pressure within hermetically-sealed cavity 78 may vary as compared to (and will typically be significantly less than) the pressure within hermetically-sealed cavity 58 and can be chosen to optimize performance of MEMS gyroscope 76. Bond pads 80 are provided on bond shelf regions of ASIC die 72, which extend laterally beyond accelerometer die 32. To interconnect ASIC die 72 with accelerometer die 32 (and, therefore, also magnetometer die 42), wire bonds 82 may be formed between selected accelerometer bond pads 38 and ASIC bond pads 80. Wirebonding may likewise be utilized to interconnect ASIC 72 and gyroscopic die 74 or, instead, the circuitry formed on ASIC die 72 may be electrically coupled to die 72 through a number of TSVs 84 formed through die 72. As further indicated in FIG. 7, a number of TSVs 86 may likewise be formed through gyroscopic die 74 to provide signal communication from the frontside 88 of die 74 to the backside 89 thereof. In further embodiments, sensor die stack 32, 42 may be positioned adjacent to die stack 72, 74 in a side-by-side relationship.

Conventional processing steps may now be performed to complete fabrication of microelectronic package 50 and the other packages produced from wafer stack 30, 40. Further processing of package 50 may entail encapsulation of die stack 32, 42 and any other components packaged therewith (e.g., die stack 72, 74 shown in FIG. 7) in a molded package body. For example, a Fan-Out Wafer Level Packaging ("FO-WLP") encapsulation process may be performed during which a pick-and-place tool is used to position partially-completed microelectronic package 50 along with a number of other packages within the central opening of a taped mold frame. An encapsulant, such as a dielectric mold compound, may then be dispensed into the mold frame and over the array of semiconductor die. The encapsulant is thermally cured to produce a molded panel in which the array of semiconductor die is embedded, and the taped mold frame may be removed to reveal the frontside of the molded panel through which the semiconductor die are exposed. A carrier may then be attached to the panel backside to allow a number of build-up layers or Redistribution Layers (RDLs), as well as a BGA or other contact array, to be formed over the panel frontside and the die exposed therethrough. The RDL may include successively-deposited dielectric layers in which a number of metal traces or interconnect lines are formed to provide electrically-conductive paths between the bond pads of the embedded die and the overlying BGA. Finally, the molded panel may be singulated to yield a number of microelectronic packages each containing a different encapsulated semiconductor die.

Figure 8:
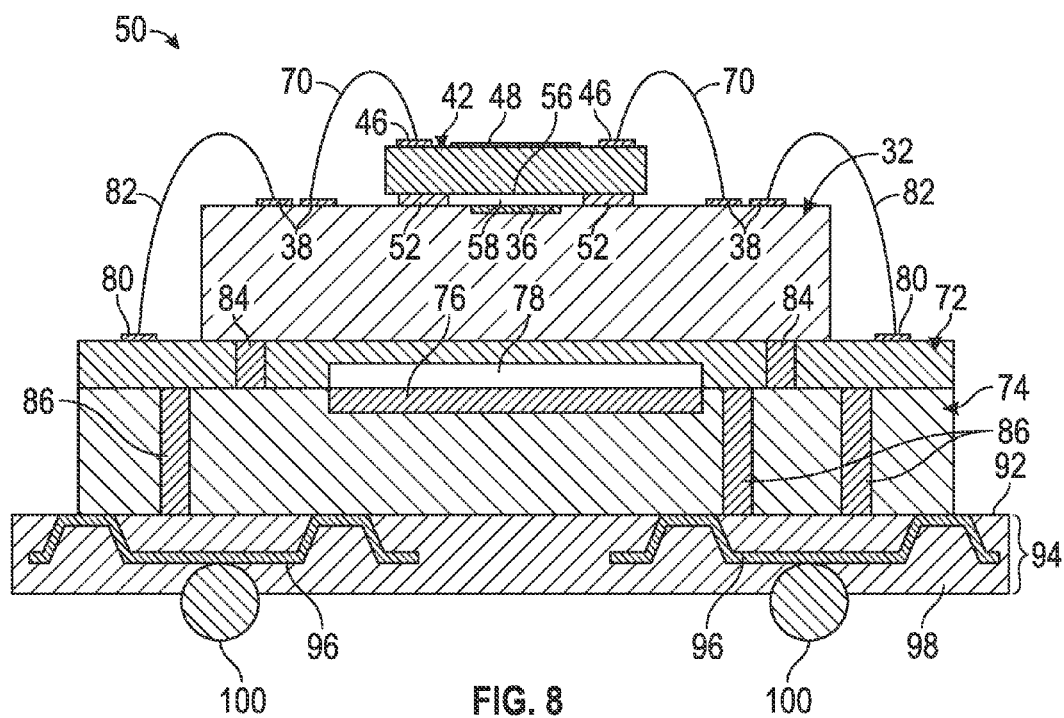

FIG. 8 illustrates microelectronic package 50 in a completed state after performance of a FO-WLP packaging process of the type described above. Die stack 32, 42 and die stack 72, 74 have been encapsulated within a molded package body 90 having a frontside 92. A number of RDLs 94 have been built-up over frontside 92 of package body 90. RDLs 94 are produced to include a network of interconnect lines 96 disposed within a body of dielectric material 98. Interconnect lines 96 may comprise various metal traces, vias, metal plugs, and/or the like, which collectively provide electrically-conductive paths between the upper surface of frontside RDLs 94 and through-silicon vias (TSVs) 86 (and, therefore, die 32, 42, 72, and 74). Package body 98 may be formed as a number of successively-deposited (e.g., spun-on) dielectric layers, while interconnect lines 96 may be formed within body 98 utilizing well-known lithographical patterning and conductive material (e.g., copper) deposition techniques; e.g., in one embodiment, each metal level may be produced by patterning a mask layer deposited over a seed layer, plating exposed regions of the seed layer with copper or another metal, and then removing the mask layer to define the desired electrically-conductive features. A contact array may be formed over RDLs 94 to provide externally-accessible points-of-contact to interconnect lines 96 (and, therefore, signal communication to packaged die 32, 42, 72, and 74). For example, bumping may be performed to produce a BGA including a plurality of solder balls 100 over the outermost RDLs 94 and in ohmic contact with interconnect lines 96, as generally shown in FIG. 8.

The foregoing has thus provided an exemplary embodiment of a microelectronic package fabrication method suitable for producing one or more packages containing a magnetometer die positioned over and bonded to an accelerometer die. In the above-described embodiment, the magnetometer die was sealingly bonded to the accelerometer die and form therewith a hermetically-sealed cavity enclosing a MEMS transducer structure provided on the accelerometer die. By utilizing the magnetometer die to cap the accelerometer die in this manner, the need for an additional cap piece can be eliminated thereby reducing package size and cost. Furthermore, the above-described wafer stacking and alignment process increases manufacturing efficiency and, more importantly, ensures precise alignment between the sensing axes beyond that typically achievable utilizing a pick-and-place tool; e.g., in certain embodiments, alignments within few hundredths of a degree can be achieved. The ability to reliably attain such precision alignment may eliminate or at least reduce post-fabrication testing requirements.

In the above-described exemplary embodiment, sensor die stack 32, 42 is incorporated a particular type of microelectronic package, namely, FO-WLP package 50 shown in FIG. 8. This example notwithstanding, it is emphasized that sensor die stack 32, 42 can be incorporated into various different types of package, including Chip Scale Packages (CSP packages) and other packages produced in accordance with Fan-In Wafer Level Packaging (FI-WLP) approaches. Additionally, while the FO-WLP package 50 was produce to include an Input/Out (I/O) structure in the form of one or more redistribution layers and BGA, it will be appreciated that various other I/O structures can be utilized in conjunction with the particular package into which die stack 32, 42 is incorporated. For example, in embodiments wherein die stack 32, 42 is incorporated into a FI-WLP package, one or more redistribution layers, a leadframe, an interposer, or the like may be utilized to provide signal communication to die stack 32, 42 and any other microelectronic components contained within the package body. The particular contact array employed will likewise vary in conjunction with the chosen I/O structure and can assume any form providing points-of-contact accessible from the exterior of the microelectronic package. While, in the above-described exemplary embodiment, the magnetometer wafer was bonded to the accelerometer wafer in an face-up orientation, the magnetometer wafer may be bonded to the accelerometer wafer in a face-down orientation such that the wafer frontsides are positioned adjacent one another. An exemplary embodiment of a multi-sensor package wherein magnetometer and accelerometer wafers are bonded in such a face-to-face or frontside-to-frontside configuration is described below in conjunction with FIGS. 9 and 10.

Figure 9:
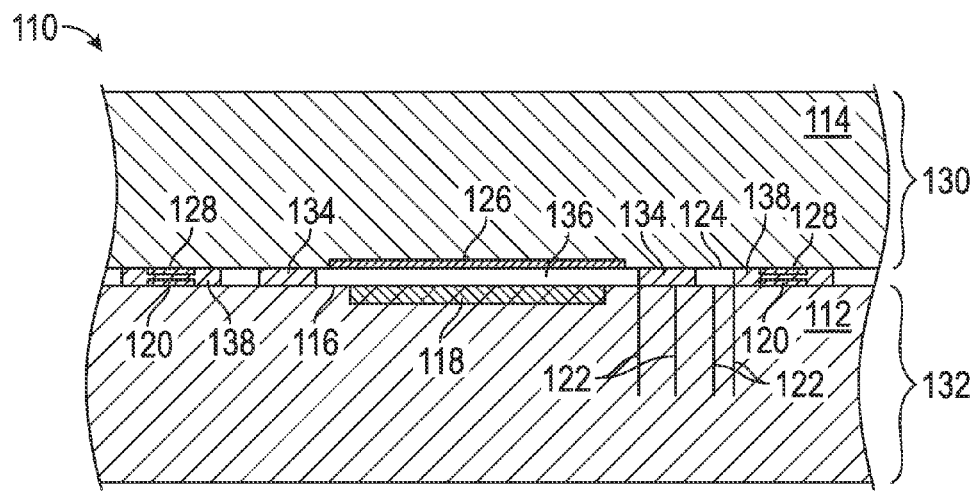
FIGS. 9 and 10 are cross-sectional views of a microelectronic package as illustrated in at various stages of completion and fabricated in accordance with a further exemplary embodiment of the microelectronic package fabrication method.
Figure 10:
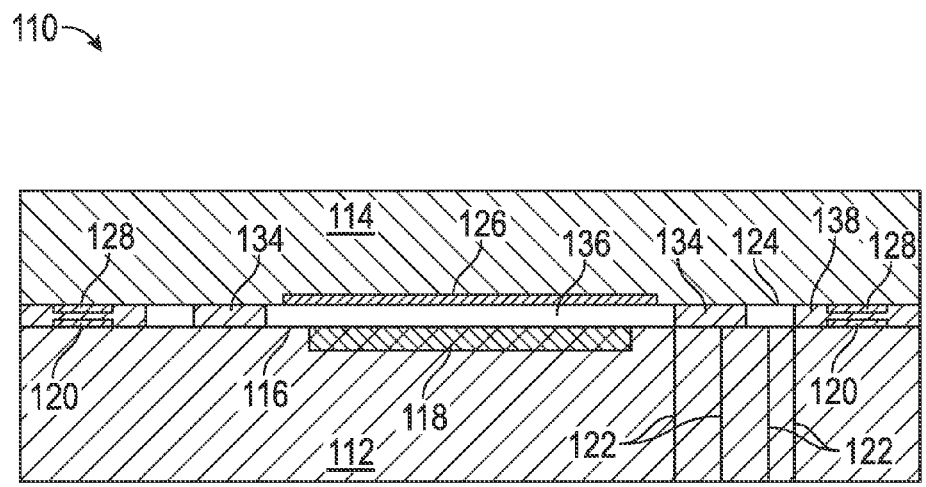

FIGS. 9 and 10 are cross-sectional views of a microelectronic package 110 shown in a partially-completed state and illustrated in accordance with a further exemplary embodiment of the present invention. As was previously the case, microelectronic package 110 includes an accelerometer die 112 and a magnetometer die 114, which is positioned over and bonded to accelerometer die 112. Accelerometer die 112 includes, in turn, a frontside 116 over which a MEMS accelerometer structure 118 and a number of bond pads 120 are disposed. Additionally, a number of TSVs 122 are formed in the body of accelerometer die 112. Magnetometer die 114 likewise includes a frontside 124 over which a magnetometer structure 126 and a number of bond pads 128 are formed. Magnetometer die 114 is advantageously bonded over accelerometer die 112, while die 112 and 114 remain in wafer form. Thus, as indicated in FIG. 9, a magnetometer wafer 130 containing magnetometer die 114 (as well as a number of other non-illustrated magnetometer die) may be positioned and bonded over an accelerometer wafer 132 containing accelerometer die 112 (as well as a number of other non-illustrated accelerometer die) using a wafer level stacking process similar to that described above; e.g., bonding material rings 134 may be deposited between die 112 and 114 and around MEMS accelerometer structure 118 to create a hermetically-sealed cavity 136 enclosing structure 118.

In contrast to the exemplary embodiment described above in conjunction with FIGS. 1-8, magnetometer wafer 130 and accelerometer wafer 132 (and, more specifically, magnetometer die 114 and accelerometer die 112) are bonded in face-to-face configuration; that is, such that the frontside 124 of die 114 is bonded directly to the frontside 116 of die 112. In this case, electrically-conductive bodies 138 may be deposited to electrically interconnect bonds pads 128 provided on magnetometer die 114 with corresponding bond pads 120 provided on accelerometer die 112. Furthermore, as may be appreciated by comparing FIG. 10 to FIG. 11, back-grinding, Chemical Mechanical Planarization (CMP), or another thinning process may be performed after bonding to bring wafers 130 and 132 to a desired final thickness and expose TSVs 122 through the backside of wafer 132 and accelerometer die 122. The wafer stack may then be singulated to separate die stack 112, 114 shown in FIG. 10 from the other non-illustrated die stacks. Die stack 112, 114 may then be combined with additional sensors and/or other microelectronic components, as appropriate to achieve the desired package functionality; e.g., as noted above, die stack 112, 114 may be combined with a three axis gyroscope to yield a 9-DOF microelectronic package. Additional processing steps (e.g., encapsulation and formation of an I/O structure) may then be performed to complete fabrication of package 110 in the above-described manner.

There has thus been provided multiple exemplary embodiments of a fabrication method for producing a multi-sensor microelectronic package. In one embodiment, the method includes positioning a magnetometer wafer comprised of an array of non-singulated magnetometer die over an accelerometer wafer comprised of an array of non-singulated accelerometer die. The magnetometer wafer is bonded to the accelerometer wafer to produce a bonded wafer stack. The bonded wafer stack is then singulated to yield a plurality of multi-sensor microelectronic packages each including a singulated magnetometer die bonded to a singulated accelerometer die. In a further embodiment, the above-described fabrication method includes the steps/processes of obtaining (whether by independent fabrication, purchase from a supplier, or otherwise) a magnetometer die and an accelerometer die each having multiple sensing axes. The magnetometer die is then positioned over an accelerometer die such that the sensing axes of the magnetometer die align with the sensing axes of the accelerometer die. The magnetometer die is preferably positioned over the accelerometer die, while both die remain in non-singulated wafer form utilizing a wafer stacking technique of the type described above; however, the possibility that positioning is performed after singulation of the magnetometer die and/or the accelerometer die in at least some embodiments is by no means precluded. The magnetometer die may be bonded to the accelerometer die such that a hermetically-sealed cavity is created enclosing a MEMS transducer structure formed on the accelerometer die.

Embodiments of a multi-sensor microelectronic package have also been provided. In one embodiment, the microelectronic package includes a singulated accelerometer die having a MEMS transducer structure, a singulated magnetometer die positioned over the transducer structure, and a ring of bonding material. The ring of bonding material bonds the singulated magnetometer die to the singulated accelerometer die such that a hermetically-sealed cavity is formed enclosing the transducer structure.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A multi-sensor microelectronic package, comprising:
  a singulated accelerometer die comprising:
    a first Microelectromechanical Systems (MEMS) transducer structure;
    a bond pad shelf; and
    a first row of bond pads on the bond pad shelf;
  a singulated magnetometer die positioned over the first MEMS transducer structure;
  a ring of bonding material bonding the singulated magnetometer die to the singulated accelerometer die; and
  a first hermetically-sealed cavity formed between the singulated magnetometer and the singulated accelerometer die, circumferentially bounded by the ring of bonding material, and enclosing the first MEMS transducer structure.

2. The multi-sensor microelectronic package of claim 1 wherein the singulated magnetometer die comprises:
  a frontside;
  a backside opposite the frontside; and
  a second MEMS transducer structure formed on the frontside and aligning with the first MEMS transducer structure, as taken along an axis orthogonal to the frontside.

3. The multi-sensor microelectronic package of claim 1 wherein the singulated magnetometer die comprises:
  a backside;
  a second row of bond pads on the backside of the singulated magnetometer die and wirebonded to the first row of bond pads; and
  a sawn vertical sidewall located between the second row of bond pads and the first row of bond pads, as taken along an axis parallel to the backside.

4. The multi-sensor microelectronic package of claim 3 further comprising an Application Specific Integrated Circuit (ASIC) die adjacent the singulated accelerometer die and having a third row of bond pads wirebonded to the second row of bond pads.

5. The multi-sensor microelectronic package of claim 1 further comprising a gyroscope die interconnected with the singulated magnetometer die and with the singulated accelerometer die.

6. The multi-sensor microelectronic package of claim 1 wherein the singulated magnetometer die comprises:
  a frontside;
  a backside opposite the frontside; and
  a second MEMS structure formed on the frontside and aligning with the first MEMS structure, as taken along an axis orthogonal to the frontside.

7. The multi-sensor microelectronic package of claim 1 wherein the ring of bonding material is composed of an electrically-conductive material.

8. A multi-sensor microelectronic package comprising:
  a singulated accelerometer die comprising a frontside on which a first Microelectromechanical Systems (MEMS) transducer structure is formed;
  a singulated magnetometer die positioned over the first MEMS transducer structure, the singulated magnetometer die comprising:
    a frontside;
    a backside opposite the frontside; and
    a second MEMS structure formed on the frontside of the singulated magnetometer die and aligning with the first MEMS structure, as taken along an axis orthogonal to the frontside;
  a ring of bonding material bonding the backside of the singulated magnetometer die directly to the frontside of the singulated accelerometer die; and
  a first hermetically-sealed cavity formed between the singulated magnetometer and the singulated accelerometer die, circumferentially bounded by the ring of bonding material, and enclosing the first MEMS transducer structure.

9. The multi-sensor microelectronic package of claim 8 wherein the ring of bonding material is composed of an electrically-conductive material.

10. The multi-sensor microelectronic package of claim 8 further comprising:
   a bond pad on the frontside of the singulated magnetometer die; and
   a through silicon via formed through the singulated accelerometer die and electrically coupled to the bond pad through the ring of bonding material.

11. The multi-sensor microelectronic package of claim 8 wherein the singulated accelerometer die comprises:
   a bond pad shelf; and
   a first row of bond pads on the bond pad shelf.

12. The multi-sensor microelectronic package of claim 11 wherein the singulated magnetometer die comprises:
   a backside;
   a second row of bond pads on the backside of the singulated magnetometer die and wirebonded to the first row of bond pads; and
   a sawn vertical sidewall located between the second row of bond pads and the first row of bond pads, as taken along an axis parallel to the backside.

13. The multi-sensor microelectronic package of claim 12 further comprising an Application Specific Integrated Circuit (ASIC) die adjacent the singulated accelerometer die and having a third row of bond pads wirebonded to the second row of bond pads.

14. The multi-sensor microelectronic package of claim 8 further comprising a gyroscope die interconnected with the singulated magnetometer die and with the singulated accelerometer die.

15. The multi-sensor microelectronic package of claim 14 further comprising:
   an Application Specific Integrated Circuit (ASIC) die adjacent the singulated accelerometer die; and
   a second hermetically-sealed cavity formed between the gyroscopic die and the ASCI die;
   wherein the gyroscope die comprises a third MEMS transducer structure enclosed by the second hermetically-sealed cavity.

16. A multi-sensor microelectronic package, comprising:
   a singulated accelerometer die having a frontside, a backside opposite the frontside, and a first Microelectromechanical Systems (MEMS) transducer structure formed on the frontside;
   a singulated magnetometer die having a frontside, a backside opposite the frontside, and a second MEMS transducer structure formed on the frontside; and
   bonding material bonding the backside of the singulated magnetometer die directly to the frontside of the singulated accelerometer die.

17. The multi-sensor microelectronic package of claim 16 further comprising a first hermetically-sealed cavity formed between the singulated magnetometer die and the singulated accelerometer die, the first hermetically-sealed cavity enclosing the first MEMS transducer structure and containing a first internal pressure.

18. The multi-sensor microelectronic package of claim 17 further comprising a gyroscope die disposed in a stacked relationship with the singulated accelerometer die and the singulated magnetometer die, the gyroscope die having a third MEMS transducer formed thereon.

19. The multi-sensor microelectronic package of claim 18 further comprising:
   an Application Specific Integrated Circuit (ASIC) die disposed between the gyroscope die and the accelerometer die; and
   a second hermetically-sealed cavity formed between the ASIC die and the gyroscope die, the second hermetically-sealed cavity enclosing the third MEMS transducer structure and containing a second internal pressure less than the first internal pressure.

20. The multi-sensor microelectronic package of claim 19 wherein the ASIC die comprises at least one bond shelf region extending laterally beyond the accelerometer die.

\* \* \* \* \*